United States Patent [19]
Allison et al.

[11] Patent Number: 5,218,322
[45] Date of Patent: Jun. 8, 1993

[54] SOLID STATE MICROWAVE POWER AMPLIFIER MODULE

[75] Inventors: Robert Allison, Rancho Palos Verdes; Gerald A. Cox, Playa Del Rey, both of Calif.

[73] Assignee: Hughes Aircraft Company, Los Angeles, Calif.

[21] Appl. No.: 864,980

[22] Filed: Apr. 7, 1992

[51] Int. Cl.⁵ .............................................. H03F 3/60
[52] U.S. Cl. ..................................... 330/286; 330/295
[58] Field of Search ................... 330/53, 56, 57, 286, 330/295, 302, 306, 387, 307

[56] References Cited
U.S. PATENT DOCUMENTS 4,234,854 11/1980 Schellenberg et al. ............. 330/286

Primary Examiner—Steven Mottola
Attorney, Agent, or Firm—L. A. Alkov; W. K. Denson-Low

[57] ABSTRACT

A solid state high power microwave amplifier module. The module incorporates a stacked assembly of integrated low temperature cofired ceramic substrates forming a monolithic structure containing all the microwave circuitry required to combine the output power of a large number of monolithic microwave integrated circuit power amplifier chips, a heatsink and a power supply. One substrate defines an input radial power divider circuit for dividing the input signal into input signals for each power amplifier chip. The second substrate includes the power amplifier chips and a radial combiner circuit. The output of the combiner to coupled to an output waveguide in the heatsink. The module is lightweight and small in size, and of high reliability since the number of wire bonds is greatly reduced since most of the microwave circuitry and connections can be formed as part of the integrated structure.

20 Claims, 6 Drawing Sheets

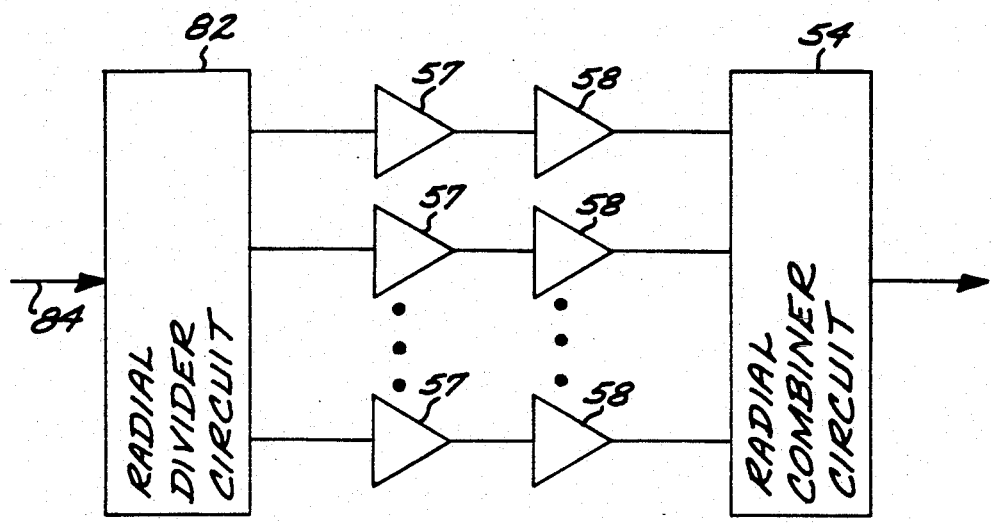
FIG. 3
FIG. 4
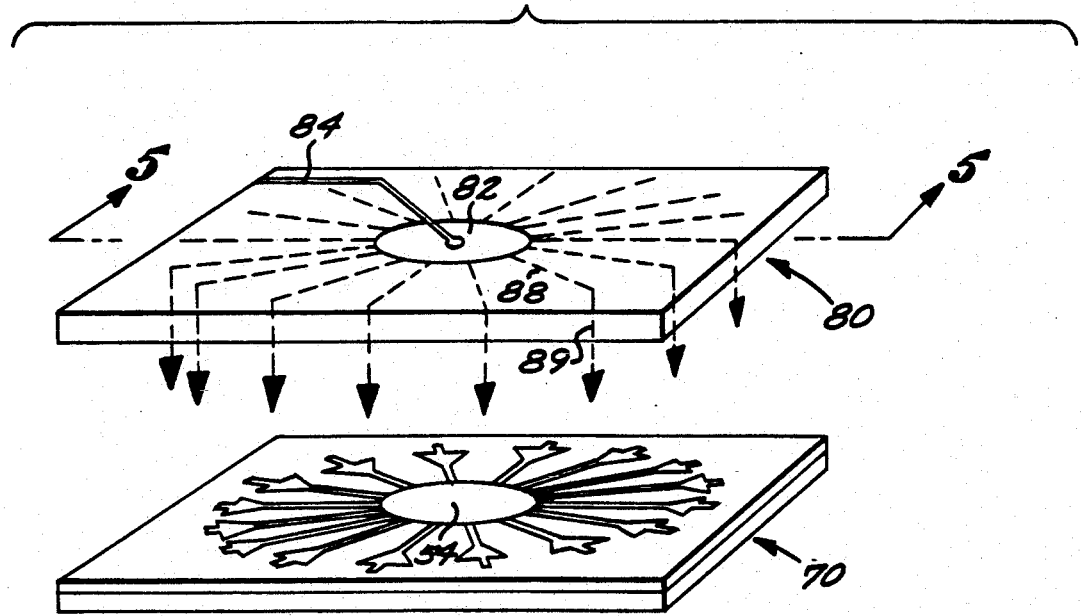

1

SOLID STATE MICROWAVE POWER AMPLIFIER MODULE

BACKGROUND OF THE INVENTION

The present invention relates to solid state high power microwave amplifier modules such as are used in radar array systems.

High power microwave power amplifier applications have in the past often employed travelling wave tubes to provide the power magnification. Such applications require highvoltage power supplies, are quite heavy and consume considerable space.

Solid state power amplifier modules have been proposed or built, which employ radial combiner circuits to combine the outputs from a number of solid state amplifiers using conventional microwave integrated circuit technology. A. Fathy and D. Kolokitis, in their paper "Analysis and Design of a 30-Way Radial Combiner for Ku-band Applications," RCA Review, Vol. 47, December 1986, pages 487-508, describe a radial combiner circuit which can be employed in a solid state power structure. The physical problem of interconnecting the power divider, amplifiers, and combiner circuits results in a relatively large structure as can be seen in the circuit and in previous implementations. This invention describes a method of overcoming this problem and results in a much more compact circuit.

It is therefore an object of the invention to provide a solid state power module which has cost, size and reliability improvements over the above approaches.

SUMMARY OF THE INVENTION

A solid state high power microwave amplifier module in accordance with the present invention incorporates a stacked assembly of integrated ceramic substrates. The module includes a first substrate formed of a low temperature cofired ceramic material. The first substrate comprises a radial power divider for dividing the power of an input signal into a plurality of radially extending transmission lines defined on the substrate and terminating in respective output ends.

The module further includes a second ceramic substrate which comprises a plurality of active solid state power amplifiers mounted thereon, transmission line circuitry for connecting respective output ends of the radially extending transmission lines to inputs of respective ones of the amplifiers, and a radial power combiner for combining the outputs of the respective amplifiers and providing a combiner output. The second substrate preferably is fabricated from a material such as aluminum nitride, to provide good heat conductivity.

In a preferred form, the module further includes a heatsink assembled adjacent the second substrate and comprising a waveguide coupled to the combiner output.

BRIEF DESCRIPTION OF THE DRAWING

These and other features and advantages of the present invention will become more apparent from the following detailed description of an exemplary embodiment thereof, as illustrated in the accompanying drawings, in which:

FIG. 3 is an electrical schematic block diagram of the module.

FIG. 4 is a simplified, exploded view of a module embodying the invention.

DETAILED DESCRIPTION OF THE PREFERRED EMBODIMENT

Overview of the Invention

The invention comprises a packaging concept for a solid state high power microwave amplifier module. The module concept incorporates a stacked assembly of microwave circuitry, heatsink, and power supply in a very compact configuration. A key feature of the module is in a ceramic structure comprising low temperature cofired ceramic (LTCC) material. LTCC packages are described, for example, in U.S. Pat. No. 4,899,118. LTCC permits the formation of microwave transmission line structures in the vertical as well as horizontal planes. This is accomplished in a single ceramic structure that is manufactured by an automatable process so that the circuits are potentially inexpensive to produce.

This invention allows the fabrication of a microwave power amplifier module that is small in size and low in weight. Additionally, the invention results in inexpensive power modules because the LTCC material enables the construction of microwave circuitry by automated processes minimizing skilled labor. Reliability is increased by reducing wire bonds since most of the microwave circuitry and connections are formed as part of the LTCC structure.

In a general sense, the module comprises a divider substrate and a combiner substrate, the substrates being bonded together to form an integrated structure. The divider substrate carries a radial microwave signal divider for dividing an input signal into a number of divider output signals, for each of the solid state amplifiers carried on the combiner substrate. The divider substrate is fabricated of LTCC material. The combiner substrate is also a ceramic material, which can be LTCC but, for improved heat conduction, is preferably a ceramic such as aluminum nitride. The two substrates are joined together, so that the divider output signals are conducted via vertical coaxial transmission lines integrated into the substrates to corresponding transmission lines in the combiner substrate which lead to the respective solid state MMIC amplifiers. The amplifier outputs are fed to a radial microwave signal combiner circuit defined in the combiner substrate which combines the amplified output signals into a single combiner output signal.

A Preferred Embodiment of the Module

Figure 1:
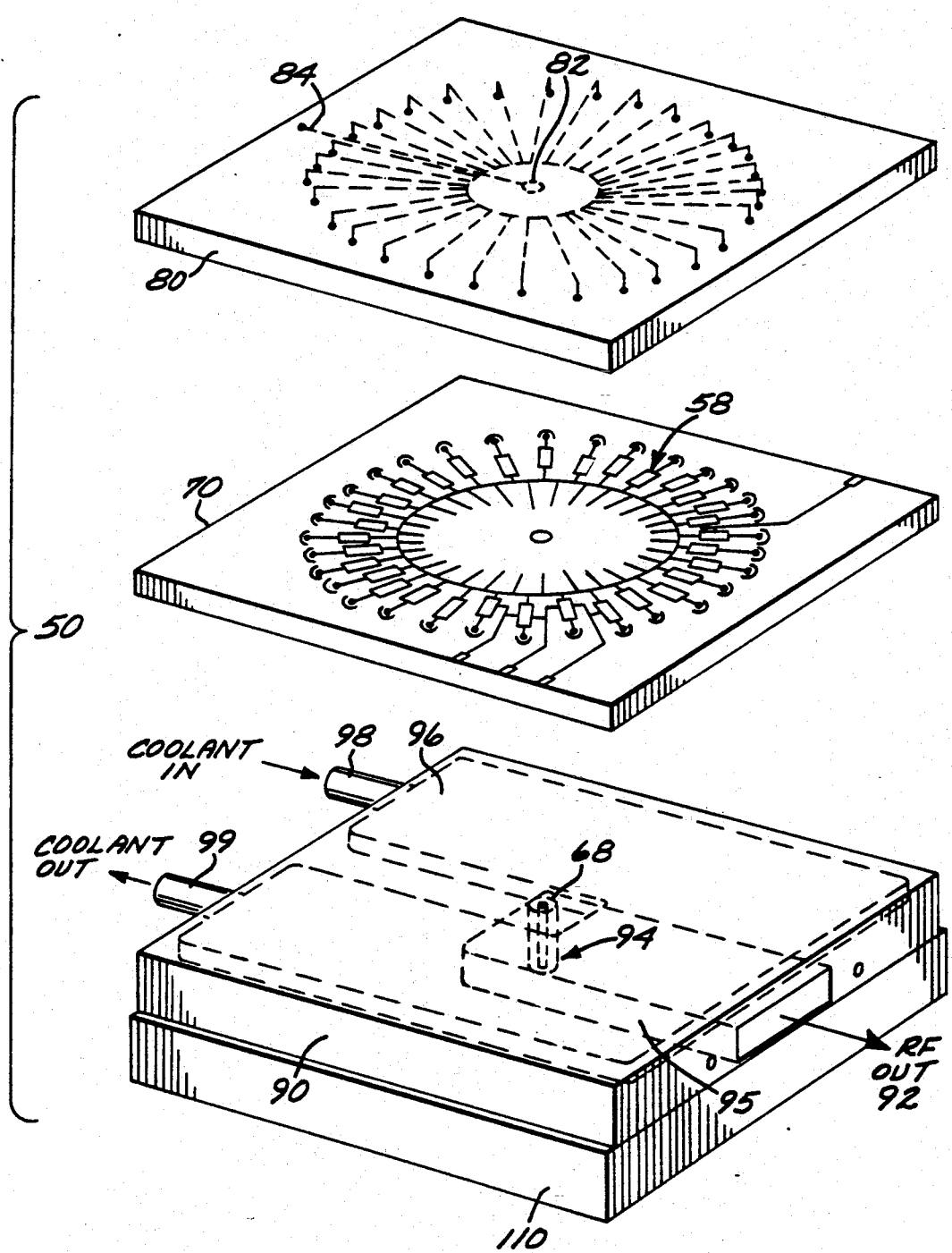
FIG. 1 is an exploded view of a solid state microwave power module embodying the present invention.

An exploded view of a module 50 embodying the invention is shown in FIG. 1, and comprises divider substrate 80 and combiner substrate 70 which are bonded together. The divider substrate 80 is fabricated of LTCC layers and comprises a radial transmission line power splitter 82, stripline distribution of the radial line outputs, and an input transmission line 84 extending from the edge of the substrate 80 to the radial line divider 82. The stripline transmission lines distributing the divider output signals provide isolation between the inputs to MMIC amplifiers 58 of the combiner substrate and the amplifier outputs to prevent coupling resulting in undesired oscillations. Isolation is achieved through the use of stripline and coaxial transmission lines which confine the electromagnetic fields either between two ground planes or within a ground conductor cylinder. The LTCC material allows the creation of these shielded transmission lines. Ground conductors in the horizontal plane are created by a metal layer in the LTCC structure. Ground conductors for vertical transmission lines are created by stacking arrays of closely spaced metal filled via holes within the LTCC dielectric layers.

Figure 2:
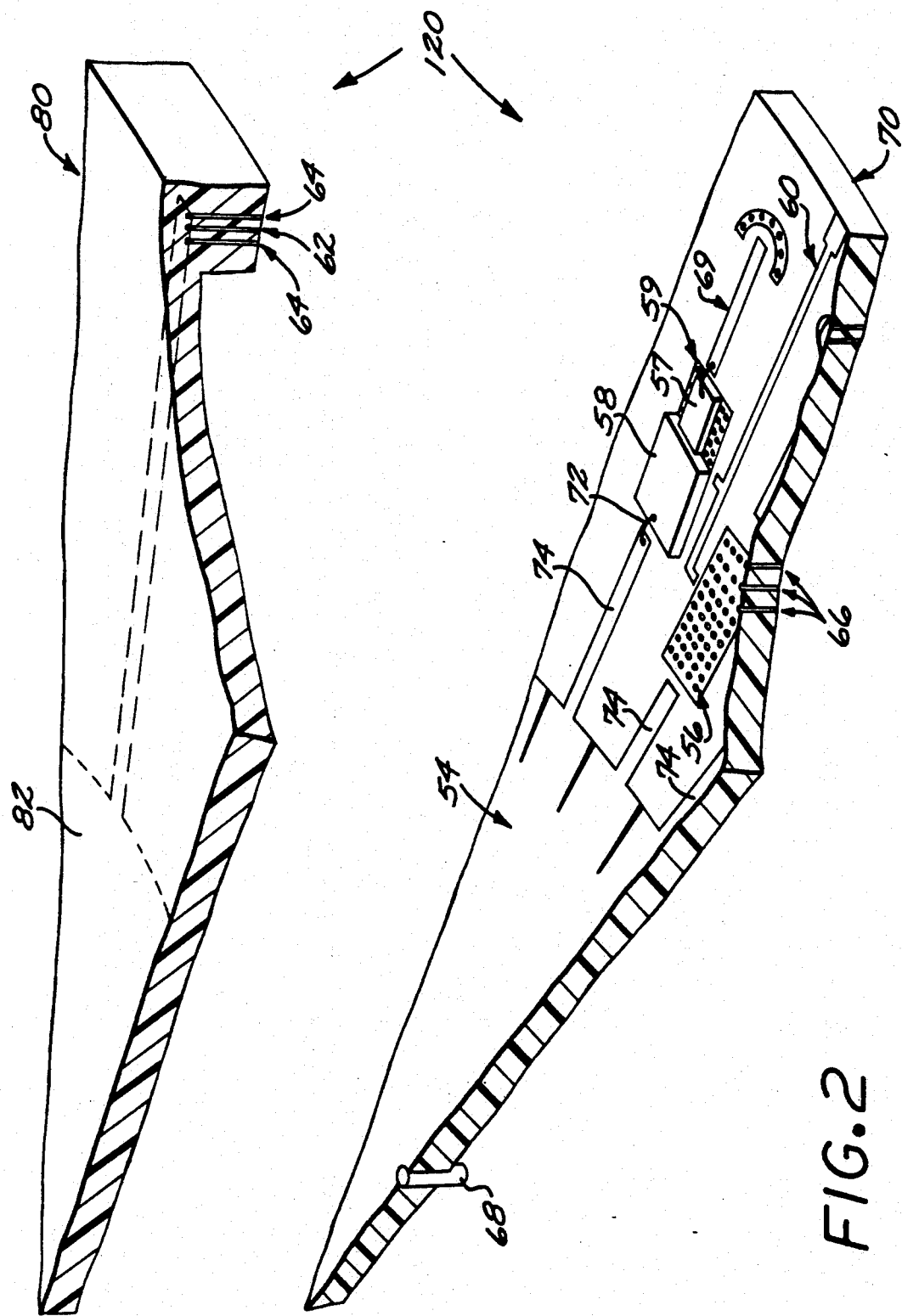
FIG. 2 is a broken-away, partial perspective view of the divider and combiner substrates comprising the module of FIG. 1.

FIG. 2 shows a cutaway, perspective view of a slice 120 of the divider and combiner substrates 80 and 70. The divider substrate 80 includes embedded vertical coaxial rf transitions comprising coaxial center conductors 62 extending down to the interface with the combiner substrate 70 (FIG. 1). A plurality of metal filled vias 64 surround each coaxial transition center conductor 62 to collectively define the grounded coaxial outer conductors.

The combiner substrate 70 comprises a radial transmission line combiner circuit 54, a plurality of ground pads 56 defined on the substrate 52 to mount a plurality of drivers 57 and high power MMIC amplifiers 58, the DC voltage distribution lines 60 to power and control the active elements, and metal filled vias 66 for rf grounding and heatsinking of the MMICs.

A microstrip transmission line 69 connects each vertical coaxial transition to the corresponding driver 57, with a wire bond 59 completing the connection.

The amplified output of each MMIC amplifier 58 is connected via a wire bond connection 72 to a microstrip transmission line conductor 74 which connects to the metallization for the radial combiner circuit 54, as shown in FIG. 2.

Referring again to FIG. 1, the module 50 further comprises a module heatsink 90 which includes a waveguide rf output 92 and transition 94 to waveguide from the coaxial output 68 of the first substrate 70. The heatsink 90 also contains passages 96 for coolant flow. A coolant inlet pipe 98 and a coolant outlet pipe 99 extend into the coolant passages 96 to provide a means for circulating coolant through the heat sink 90.

A power supply module 110 is attached to the opposite side of the heatsink 90 from the substrates 70 and 80.

FIG. 3 is a simplified schematic diagram of module 50. The RF input is provided to the module on input line 84 to the radial divider circuit 82, in this embodiment a 1:32 divider circuit. The respective divider output signal are connected to the corresponding driver circuits 57 and solid state amplifiers 58 on the combiner substrate 70. The 32 amplified outputs are in turn connected to the 32:1 radial combiner circuit 54. The combiner output is the module output, and represents a highly amplified version of the RF input signal.

FIG. 4 is a simplified diagrammatic exploded view of the module 50, and illustrates the signal flow from the input signal through the radial divider 82 on substrate 80, through the MMIC amplifier circuits on the combiner substrate 70, and then to the combiner circuit 54 to the RF output.

Figure 5:
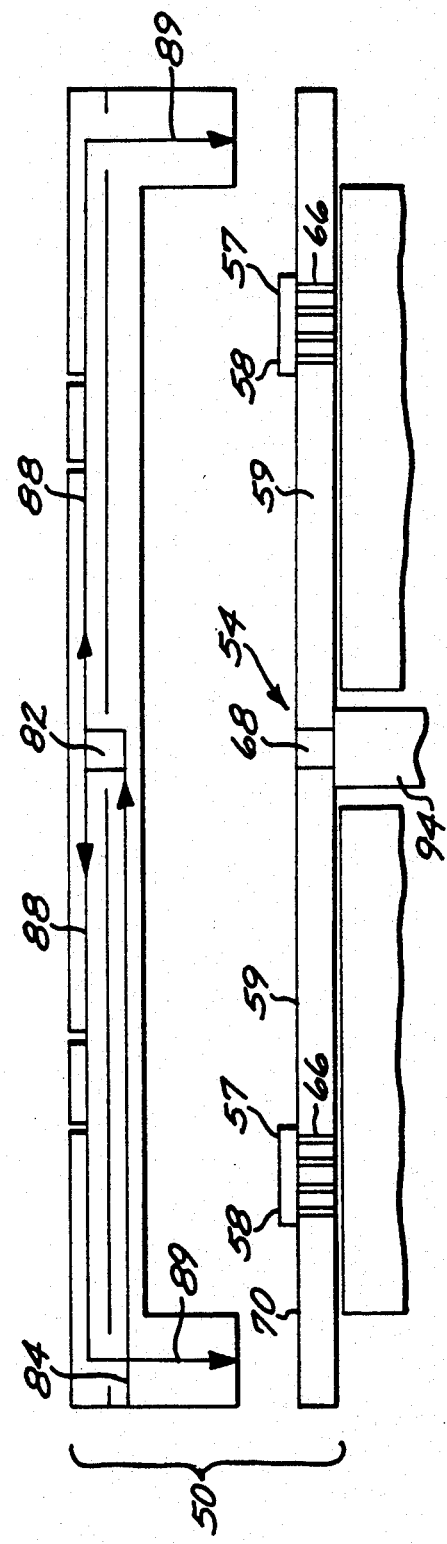
FIG. 5 is a simplified cross sectional view of the radial divider and combiner substrate of a module embodying the invention.

The signal flow through the module 50 is more fully shown in FIG. 5, a cross sectional view taken along line 5—5 of FIG. 4. The RF input signal enters the module on transmission line 84 in substrate 80, and is conducted to the radial divider circuit 82. The radial divider circuit divides the input signal into many divider output signals which are conducted via transmission lines 88 to the respective vertical coaxial transmission lines 89 (comprising center conductor 62 and outer conductor 64 shown in FIG. 2) which connect the substrates 80 and 70. The signals are in turn conducted from the coaxial transmission lines 89 to the MMIC circuits 57 and 58. The amplified signals are then conducted via lines 59 to the radial combiner circuit 54, and the combiner RF output of the module is conducted away.

Figure 6:
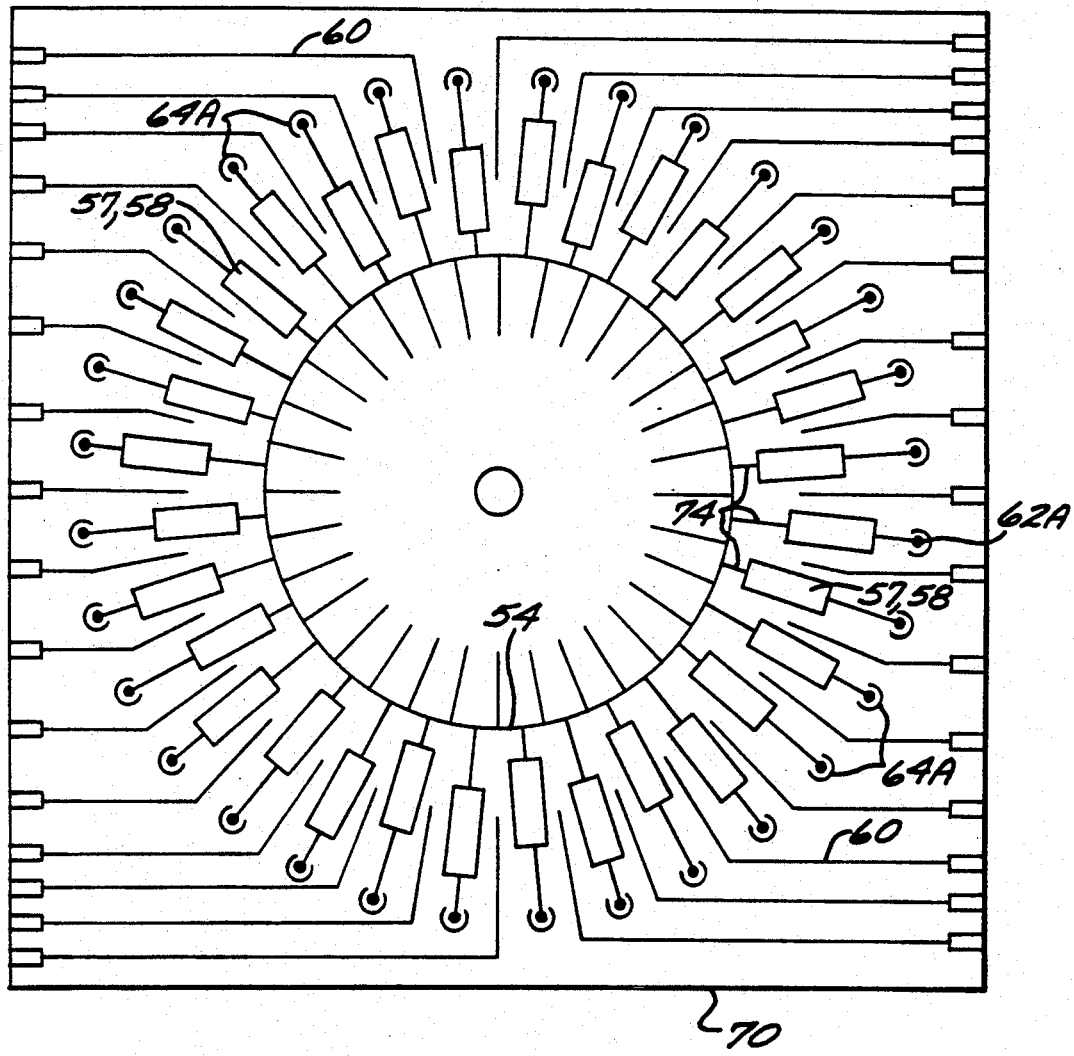
FIG. 6 is a top view of an illustrative embodiment of a radial combiner substrate for a module embodying the invention.

FIG. 6 is a top view of the combiner substrate 70, showing the radial nature of the combiner circuit 54, the layout of the MMIC power amplifier circuits 57 and 58, and the manner in which the dc inputs to the MMIC circuits can be made. The ground vias 64A and center conductor pads 62A which make electrical contact respectively with vertical vias 64 and center conductors 62 of the divider substrate are also shown in this view.

Figure 7:
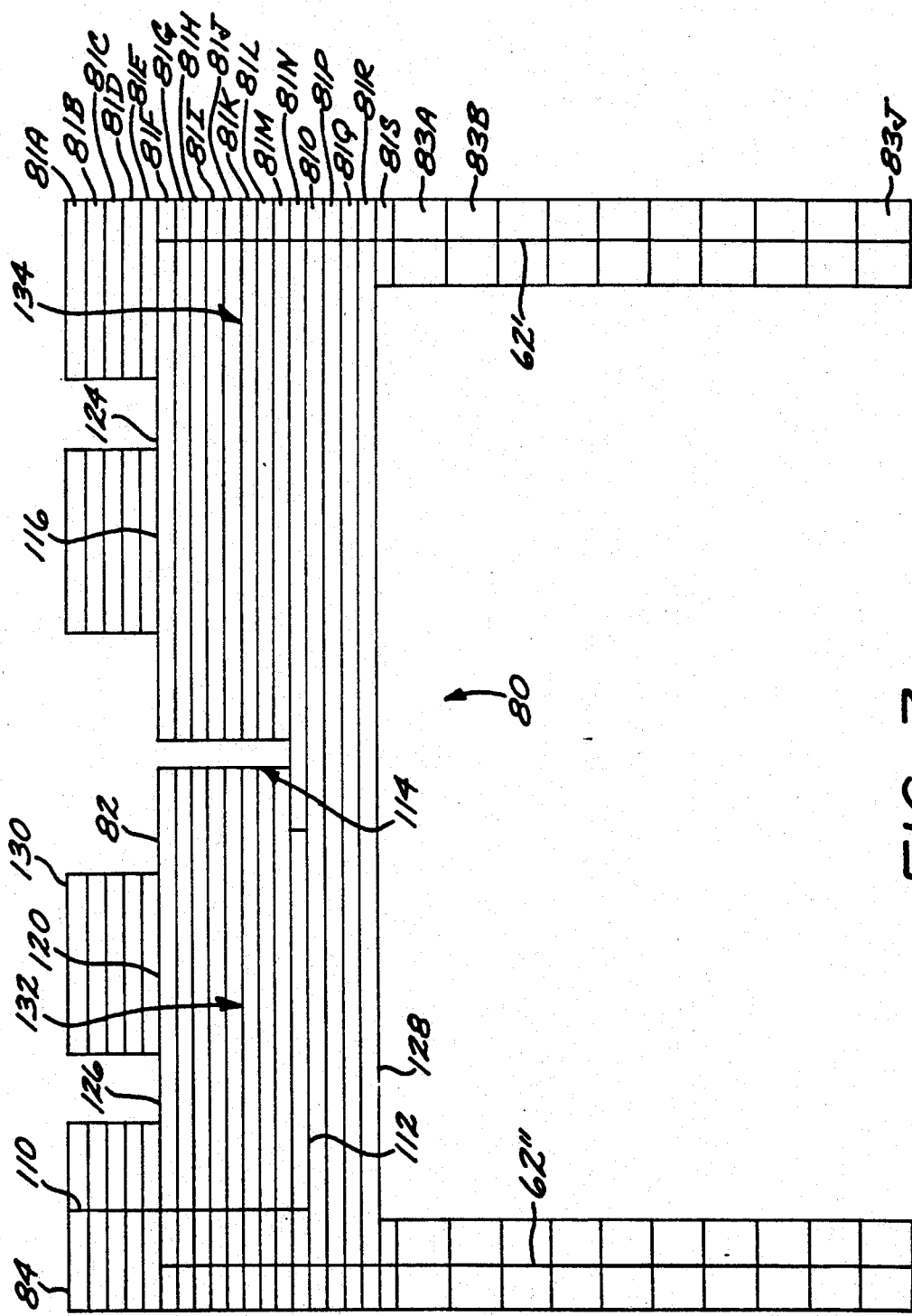
FIG. 7 is a cross section of a radial divider substrate of a module embodying the invention.

FIG. 7 is a cross-sectional view of the divider substrate 80, with an exaggerated vertical scale to illustrate the different LTCC layers comprising the substrate. In this embodiment, there are sixteen layers 81A–81S of a first thickness, e.g., 0.003 inch, of LTCC material, and ten layers 83A-J of a second thickness, e.g., 0.010 inch, of LTCC material forming the annular peripheral region of the substrate through which the vertical coaxial lines 89 extend. In an exemplary embodiment the thickness of all layers 81A–81S and 83A-J aggregates 0.10 inch.

The input RF signal is provided via microstrip input line 84, which conducts the signal to a center conductor 110 of a vertical coaxial line which extends down to a stripline 112 buried within the substrate 80 at the interface between layers 81O and 81P. The stripline 112 extends from the coaxial transmission line conductor 110 to adjacent the radial divider 82, and transitions upwardly to the interface between layers 81N and 81O to a coaxial probe 114 into the radial divider 82.

The radial divider 82 divides the input signal into 32 signals in this embodiment, i.e., the divider 82 has 32 output stripline transmission lines extending radially outwardly from the divider; two of the lines 116 and 120 are visible in FIG. 7. The striplines each include a microstrip phase tuning section used to equalize the phase on the output signals provided to the solid state amplifiers on the combiner substrate 70. For example, the line 116 has a section of microstrip 124, and the line 120 has a section of microstrip 126. Phase equalization can be achieved by adjusting the transmission line length of each leg. By providing a selectable segment of transmission line, to be wire bonded in or out as required, rough equalization can be achieved. Implementing the transmission line segments in microstrip allows access to the conductors for wire bonding.

Ground planes 128 and 130 are formed on the upper surface of the substrate 80 and the lower surface of substrate layer 81R. An additional groundplane 134 exists between layers 81J and 81K which forms the top groundplane for stripline 112 and the bottom groundplane for striplines 116 and 120.

The respective output stripline transmission lines from the radial divider outputs are connected to the center conductors of the output vertical coaxial transmission lines. The center conductors 62' and 62" of two of these lines are visible in FIG. 7. Stripline 116 is connected to the conductor 62', and stripline 120 is connected to the conductor 62". These center coaxial conductors will be mated to corresponding conductors 62A on the combiner substrate 70. The electrical connection between the power divider and combiner substrates can be made in a variety of ways, including solder, conductive epoxy, or by miniature spring contact.

Figure 8:
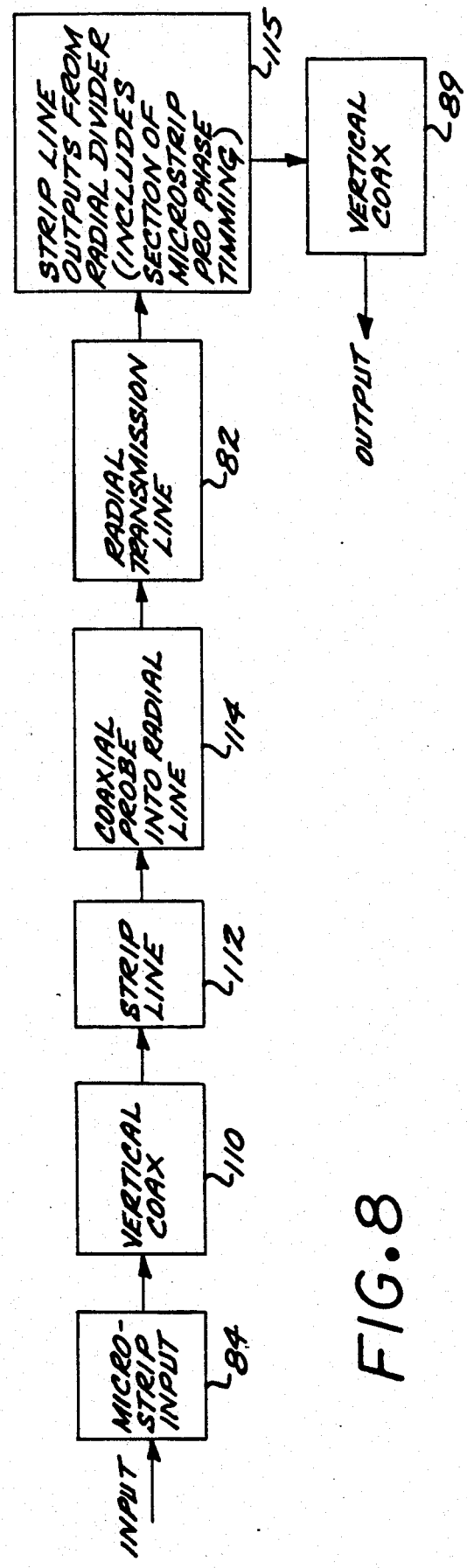
FIG. 8 is a simplified schematic block diagram illustrative of the signal flow through the divider substrate of FIG. 7.

FIG. 8 is a schematic block diagram showing the signal flow through the various transmission lines and elements of the divider substrate 80 as shown in FIG. 7. Thus, the RF input signal is provided on the microstrip line 84 to the vertical coaxial line 110, which conducts the signal to the buried stripline 112. The line 112 in turn conducts the signal to the coaxial probe into the radial line 82. The stripline outputs of the divider, shown collectively as 115 in FIG. 8 are conducted to the respective output vertical coaxial lines 89.

In one exemplary application embodying the invention, 36 MMIC amplifiers of 2.5 watts output each are combined in a single module to produce greater than 70 watts output power. The gain is approximately 30 dB.

The design of radial divider and combiner circuits is known in the art; one example is shown in the paper "Analysis and Design of a 30-Way Radial Combiner for Ku-band Applications," id.

It is understood that the above-described embodiment is merely illustrative of the possible specific embodiments which may represent principles of the present invention. Other arrangements may readily be devised in accordance with these principles by those skilled in the art without departing from the scope and spirit of the invention.

What is claimed is:

1. A solid state high power microwave amplifier module, comprising:
   a first substrate formed of a low temperature cofired ceramic (LTCC) material, said first substrate comprising radial power divider for dividing the power of an input signal into a plurality of radially extending transmission lines defined on said substrate, said transmission lines terminating in respective output ends;
   a second substrate, said second substrate comprising a plurality of active solid state power amplifiers mounted thereon, and a radial power combiner for combining the outputs of the respective amplifiers and providing a combiner output;
   said first and second substrates being assembled together to form an integrated microwave assembly;
   transmission line circuitry for connecting respective output ends of said radially extending transmission lines to inputs of respective ones of said amplifiers when said first and second substrates are assembled together; and
   a heatsink assembled adjacent said second substrate and comprising a waveguide coupled to said combiner output.

2. The module of claim 1 wherein said radial power combiner is coupled to said heat sink waveguide by a coaxial to waveguide transition.

3. The module of claim 1 wherein said heatsink further comprises coolant passages to permit coolant fluid to be circulated therethrough to conduct heat away from said heatsink.

4. The module of claim further comprising a plurality of coaxial RF transitions for coupling said transmission line ends in said first substrate to corresponding transmission lines in said second substrate which lead to the inputs of said amplifiers.

5. The module of claim 1 wherein said first ceramic substrate comprises LTCC material.

6. The module of claim 1 wherein said second substrate comprises aluminum nitride.

7. The module of claim 1 wherein said first substrate further comprises a plurality of vertical coaxial transmission lines embedded in said substrate, one each adjacent an output end of one of said radially extending transmission lines, each said coaxial line comprising a center conductor connected to said output end, and said coaxial lines extend to a surface of said first substrate which is adjacent a surface of said second substrate when said substrates are assembled together, said vertical coaxial transmission lines comprising said transmission line circuitry.

8. The module of claim 7 wherein said transmission line circuitry further comprises a plurality of coaxial lines transitions extending between said surface of said second substrate and respective stripline conductors, each said transition comprising a transition center conductive element which is electrically connected to a corresponding center conductor of a coaxial line of said first substrate when said substrates are assembled together.

9. The module of claim 1 wherein said first substrate comprises a plurality of layers of low temperature cofired ceramic (LTCC) material in which are embedded conductive material to define said radial power divider and said radially extending transmission line.

10. The module of claim 9 wherein vertical coaxial transmission lines are defined in said first substrate to connect between said transmission line output ends and the surface of said first substrate disposed adjacent said second substrate when said substrates are assembled together.

11. The module of claim 10 wherein said vertical coaxial lines are disposed in an annular region of said substrate having a first thickness, and surrounding a region of said first substrate in which said radial divider is defined, said region having a second thickness which is less than said first thickness.

12. The module of claim 10 further comprising an input microstrip line defined on said first substrate and extending to a center conductor comprising an input vertical coaxial transmission line, said input coaxial line extending to a stripline conductor buried in said first substrate, said stripline conductor in turn for conducting RF input power to a coaxial probe embedded in said first substrate for exciting said radial power divider.

13. The module of claim 1 further comprising phase compensating means for adjusting the relative phase of the RF signals at said transmission line output ends to equalize the phase of said RF signals at said transmission line output ends.

14. A solid state high power microwave amplifier module, comprising:

a first substrate formed of a low temperature cofired ceramic (LTCC) material, said first substrate comprising a radial power divider for dividing the power of an input signal into a plurality of radially extending transmission lines defined on said substrate, said transmission lines terminating in respective output ends;

a second ceramic substrate, said second substrate comprising a plurality of active solid state power amplifiers mounted thereon, and a radial power combiner for combining the outputs of the respective amplifiers and providing a combiner output;

said first and second substrates being assembled together to form an integrated microwave assembly;

transmission line circuitry for connecting respective output ends of said radially extending transmission lines to inputs of respective ones of said amplifiers; and a heatsink assembled adjacent said second substrate and comprising a waveguide coupled to said combiner output, wherein said radial power combiner is coupled to said heat sink waveguide by a coaxial to waveguide transition.

15. The module of claim 14 wherein said heatsink further comprises coolant passages to permit coolant fluid to be circulated therethrough to conduct heat away from said heatsink.

16. The module of claim 14 further comprising a plurality of coaxial RF transitions for coupling said transmission line ends in said first substrate to corresponding transmission lines in said second substrate which lead to the inputs of said amplifiers.

17. The module of claim 14 wherein said second substrate comprises aluminum nitride.

18. The module of claim 14 wherein said first substrate further comprises a plurality of vertical coaxial transmission lines embedded in said substrate, one each adjacent an output end of one of said radially extending transmission lines, each said coaxial line comprising a center conductor connected to said output end, and said coaxial lines extend to a surface of said first substrate which is adjacent a surface of said second substrate when said substrates are assembled together, said vertical coaxial transmission lines comprising said transmission line circuitry.

19. The module of claim 18 wherein said transmission line circuitry further comprises a plurality of coaxial lines transitions extending between said surface of said second substrate and respective stripline conductors, each said transition comprising a transition center conductive element which is electrically connected to a corresponding center conductor of a coaxial line of said first substrate when said substrates are assembled together.

20. The module of claim 14 further comprising phase compensating means for adjusting the relative phase of the RF signals at said transmission line output ends to equalize the phase of said RF signals at said transmission line output ends.

* * * * *